(12) United States Patent
Schuler et al.

(10) Patent No.: US 10,403,124 B1
(45) Date of Patent: Sep. 3, 2019

(54) STUN GUN DETECT

(71) Applicant: MOTOROLA SOLUTIONS, INC, Chicago, IL (US)

(72) Inventors: Francesca Schuler, Palatine, IL (US); John B. Preston, Plantation, FL (US); Daniel A. Tealdi, Plantation, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 15/935,147

(22) Filed: Mar. 26, 2018

(51) Int. Cl.
G08B 13/14 (2006.01)
G08B 25/10 (2006.01)
F41H 13/00 (2006.01)
G01R 33/02 (2006.01)
G08B 21/18 (2006.01)
F41C 33/02 (2006.01)
G10L 25/51 (2013.01)
G01R 29/08 (2006.01)

(52) U.S. Cl.
CPC ............ *G08B 25/10* (2013.01); *F41C 33/029* (2013.01); *F41H 13/0025* (2013.01); *G01R 29/08* (2013.01); *G01R 33/02* (2013.01); *G08B 21/18* (2013.01); *G10L 25/51* (2013.01)

(58) Field of Classification Search
CPC ...................................................... G08B 25/10

USPC ............ 340/568.1, 539.12, 539.22, 540, 541
See application file for complete search history.

(56) References Cited

U.S. PATENT DOCUMENTS

| 7,525,568 B2 * | 4/2009 | Raghunath | H04N 5/782 340/539.21 |
| 9,528,166 B2 | 12/2016 | Ebner et al. | |
| 2006/0082730 A1 * | 4/2006 | Franks | F41A 17/06 352/95 |
| 2007/0028501 A1 * | 2/2007 | Fressola | F41H 13/0025 42/146 |
| 2008/0061991 A1 | 3/2008 | Urban et al. | |
| 2017/0059274 A1 | 3/2017 | Crist et al. | |

FOREIGN PATENT DOCUMENTS

WO 2013053033 A1 4/2013

* cited by examiner

*Primary Examiner* — Tai T Nguyen
(74) *Attorney, Agent, or Firm* — Daniel R. Bestor

(57) ABSTRACT

A method and apparatus for detecting that a stun gun has been deployed is provided herein. During operation a periodic nature of a stun-gun voltage will be utilized to determine if the stun-gun has been fired. More specifically, an electric/magnetic field (EMF) and/or a sound will be analyzed to determine if the periodic nature of the EMF and/or sound matches that of a stun gun. If so, a command center will be notified of the event. In order to increase the accuracy of any stun-gun detect, a gun-draw sensor may be used in combination with the above technique.

15 Claims, 5 Drawing Sheets

STUN GUN DETECT

BACKGROUND OF THE INVENTION

Police departments are interested in getting real-time warnings that a stun gun has been fired. Therefore, a need exists for a method and apparatus for detecting that a stun gun has been fired, and providing this information to a command center.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

Figure 1:
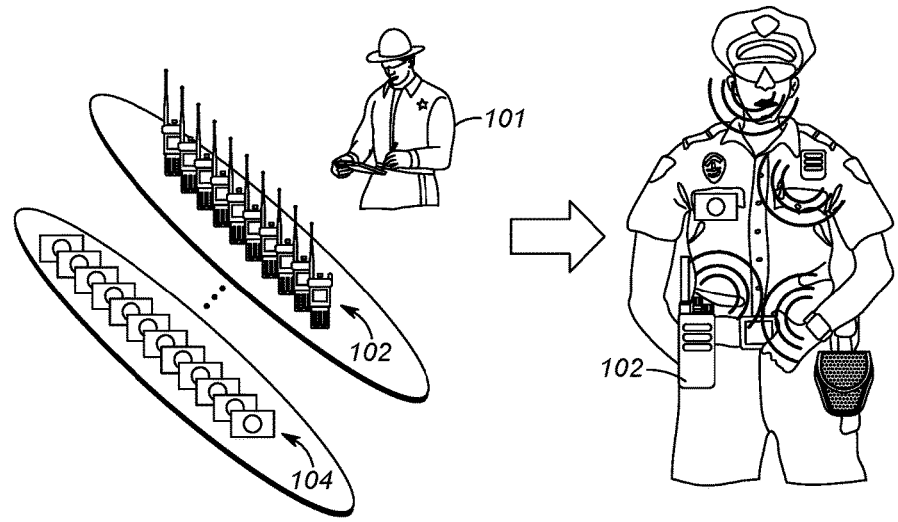
FIG. 1 illustrates an operational environment for the present invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required.

DETAILED DESCRIPTION

In order to address the above-mentioned need, a method and apparatus for detecting that a stun gun has been deployed is provided herein. During operation a periodic nature of a stun-gun voltage will be leveraged to determine if the stun-gun has been fired. More specifically, an electric/magnetic field (EMF) and/or a sound will be analyzed to determine if a periodic nature of the EMF and/or sound matches that of a stun gun. If so, a command center will be notified of the event. In order to increase the accuracy of any stun-gun detect, a gun-draw sensor may be used in combination with the above technique.

Expanding on the above, a stun gun comprises an electroshock weapon used by police departments worldwide. During operation, a blast of compressed nitrogen launches two barbed darts at around 50 meters per second. Each projectile, which weighs around 1.5 grams, has a tip (e.g., 10 mm long) to penetrate clothing and the insulating outer layer of skin. Two thin wires trail behind the darts for up to 9 meters, forming an electrical connection to the gun.

The gun is designed to generate a brief arcing pulse, which ionizes the intervening air to establish a conductive path for electricity. The arcing phase has an open circuit peak voltage of 50 000 volts; that is, the voltage is 50 kilovolts only until the arc appears or until the barbs make contact with conductive flesh, which in the worst conditions offers around 400 ohms of resistance.

The target's body is never exposed to the 50 kV, but more commonly exposed to a peak voltage of 1200. Once the barbs establish a circuit, the gun generates a series of microsecond pulses at a rate of, for example, 19 per second. Each pulse carries around 100 micro coulombs of charge, so the average current is 1.9 mill amperes. This forces the target's muscles to contract without risking electrocution of the targeted individual. Table 1 illustrates some operating parameters for various stun guns on the market.

TABLE 1

Operating Parameters for Various Stun Guns

| Brand of Stun Gun | Pulse Interval in microseconds | Duration between fires | Duration of fires | Electric Field V/cm |
|---|---|---|---|---|
| A | 19 | 500 ms | 1-5 s | 60 |
| B | 24 | 2 s | 1-5 s | 47 |
| C | 24 | 2 s | 1-5 s | 47 |
| C | 30 | 5 s | 1-7 s | 75 |

Because stun-gun voltages are pulsed at known frequencies, and for known amounts of time, this information can be leveraged to detect when a stun gun has been fired. In particular, because of the pulsating nature of stun-gun voltage (e.g., 19, 24, 30 ms between periodic voltage being applied), a microphone can listen for a sound having a pulse interval and maximum duration that is similar to that of the electro-static discharge of the stun gun. In a similar manner, an electric or magnetic field detector can monitor for a pulsing field having a pulse interval and maximum duration that is similar to that of the electro-static discharge of the stun gun. Therefore, if for example, an electric field, magnetic field, or sound is detected that pulses for 5 seconds or less, and has a 19 ms pulses, it can be assumed that a stun gun was fired. (It should be noted that the term "pulse" is meant to encompass an electric, magnetic, and/or sound pattern representing the energy released by the stun gun in a particular range of frequencies, with a particular shape (waveform).

The above technique can be used in conjunction with a holster detector to improve the accuracy of any stun-gun fire detection.

Turning now to the drawings, wherein like numerals designate like components, FIG. 1 illustrates an operational environment for the present invention. As shown, a public safety officer 101 will be equipped with devices that determine various physical and environmental conditions surrounding the public-safety officer. These conditions are generally reported back to a dispatch center (command center) so an appropriate action may be taken. For example, police officers may have a sensor that determines when a gun is drawn. Upon detecting that an officer has drawn their gun, a notification may be sent back to the dispatch operator so that, for example, the dispatch operator may be made aware of the situation and other officers in the area may be notified.

It is envisioned that the public-safety officer will have an array of shelved devices available to the officer at the beginning of a shift. The officer will select the devices off the shelf, and form a personal area network (PAN) with the devices that will accompany the officer on his shift. For example, the officer may acquire a gun-draw sensor, a body-worn camera, a wireless microphone, a smart watch, a police radio, smart handcuffs, an electric-field detector, a man-down sensor, . . . , etc. All devices pulled by the officer will be configured to form a PAN by associating (pairing) with each other and communicating wirelessly among the devices. In a preferred embodiment, the PAN comprises more than two devices, so that many devices are connected via the PAN simultaneously.

A method called bonding is typically used for recognizing specific devices and thus enabling control over which devices are allowed to connect to each other when forming the PAN. Once bonded, devices/sensors then can establish a connection without user intervention. A bond is created through a process called "pairing". The pairing process is typically triggered by a specific request by the user to create a bond from a user via a user interface on the device.

As shown in FIG. 1, public-safety officer 101 has an array of devices to use during the officer's shift (some devices may be brought to the job by the officer). For example, the officer may acquire one radio 102 and one camera 104 for use during their shift. Other devices may be pulled as well. As shown in FIG. 1, officer 101 will preferably wear the devices during a shift by attaching the devices to clothing or their body. These devices will form a PAN throughout the officer's shift.

Figure 2:
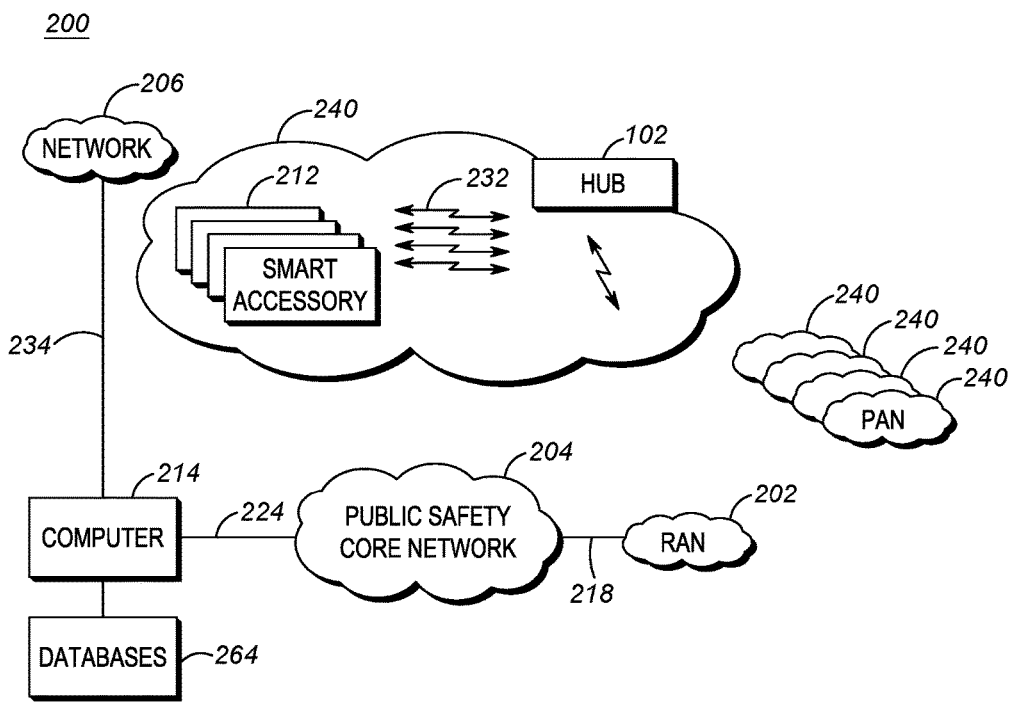
FIG. 2 depicts an example communication system that incorporates a personal-area network and a digital assistant.

FIG. 2 depicts an example communication system 200 that incorporates PANs created as described above. System 200 includes one or more radio access networks (RANs) 202, a public-safety core network 204, high-speed data network 206, hub (PAN master device) 102, local devices (slave devices that serve as smart accessories/sensors) 212, computer 214, and communication links 218, 224, 232, and 234. In a preferred embodiment of the present invention, hub 102 and devices 212 form PAN 240, with communication links 232 between devices 212 and hub 102 taking place utilizing a short-range wireless communication system protocol such as a Bluetooth communication system protocol. Each officer will have an associated PAN 240. Thus, FIG. 2 illustrates multiple PANs 240 associated with multiple officers.

RAN 202 includes typical RAN elements such as base stations, base station controllers (BSCs), routers, switches, and the like, arranged, connected, and programmed to provide wireless service to user equipment (e.g., hub 102, and the like) in a manner known to those of skill in the relevant art. RAN 202 may implement a direct-mode, conventional, or trunked land mobile radio (LMR) standard or protocol such as European Telecommunications Standards Institute (ETSI) Digital Mobile Radio (DMR), a Project 25 (P25) standard defined by the Association of Public Safety Communications Officials International (APCO), Terrestrial Trunked Radio (TETRA), or other LMR radio protocols or standards.

High-speed data network 206 is provided. Network 206 may comprise a Long Term Evolution (LTE), LTE-Advance, or 5G protocol including multimedia broadcast multicast services (MBMS) or single site point-to-multipoint (SC-PTM) over which an open mobile alliance (OMA) push to talk (PTT) over cellular (OMA-PoC), a voice over IP (VoIP), an LTE Direct or LTE Device to Device, or a PTT over IP (PoIP) application may be implemented. In still further embodiments, network 206 may implement a Wi-Fi protocol perhaps in accordance with an IEEE 802.11 standard (e.g., 802.11a, 802.11b, 802.11g) or a WiMAX protocol perhaps operating in accordance with an IEEE 802.16 standard.

Video and sensor 212 data shared among officers (and reported to dispatch center 214) is typically (but not necessarily) accomplished by utilizing network 206, capable of achieving large data rates, while voice communications take place through network 204. Thus, voice communications among public-safety officers typically take place through one network, while video shared among typically take place through another network.

Public-safety core network 204 may include one or more packet-switched networks and/or one or more circuit-switched networks, and in general provides one or more public-safety agencies with any necessary computing and communication needs, transmitting any necessary public-safety-related data and communications.

For narrowband LMR wireless systems, core network 204 operates in either a conventional or trunked configuration. In either configuration, a plurality of communication devices is partitioned into separate groups (talkgroups) of communication devices. In a conventional narrowband system, each communication device in a group is selected to a particular radio channel (frequency or frequency & time slot) for communications associated with that communication device's group. Thus, each group is served by one channel, and multiple groups may share the same single frequency (in which case, in some embodiments, group IDs may be present in the group data to distinguish between groups using the same shared frequency).

In contrast, a trunked radio system and its communication devices use a pool of traffic channels for virtually an unlimited number of groups of communication devices (e.g., talkgroups). Thus, all groups are served by all channels. The trunked radio system works to take advantage of the probability that not all groups need a traffic channel for communication at the same time.

Group calls may be made between wireless and/or wireline participants in accordance with either a narrowband or a broadband protocol or standard. Group members for group calls may be statically or dynamically defined. That is, in a first example, a user or administrator may indicate to the switching and/or radio network (perhaps at a call controller, PTT server, zone controller, or mobile management entity (MME), base station controller (BSC), mobile switching center (MSC), site controller, Push-to-Talk controller, or other network device) a list of participants of a group at the time of the call or in advance of the call. The group members (e.g., communication devices) could be provisioned in the network by the user or an agent, and then provided some form of group identity or identifier, for example. Then, at a future time, an originating user in a group may cause some signaling to be transmitted indicating that he or she wishes to establish a communication session (e.g., join a group call having a particular talkgroup ID) with each of the pre-designated participants in the defined group. In another example, communication devices may dynamically affiliate with a group (and also disassociate with the group) perhaps based on user input, and the switching and/or radio network may track group membership and route new group calls according to the current group membership.

Hub 102 serves as a PAN master device, and may be any suitable computing and communication device configured to engage in wireless communication with the RAN 202 and/or network 206 over the air interface as is known to those in the relevant art. Moreover, one or more hubs 102 are further configured to engage in wired and/or wireless communication with one or more local device 212 via the communication link 232. Hub 102 will be configured to determine when to forward information received from PAN devices 212 to, for example, dispatch center 214. The information can be forwarded to the dispatch center via RANs 202 and/or network 206 based on a combination of device 212 inputs. In one embodiment, all information received from sensors 212 will be forwarded to center 214 via RAN 202 or network 206. In another embodiment, hub 102 will filter the information sent, and only send high-priority information back to dispatch center 214.

It should also be noted that any one or more of the communication links 218, 224, 232, 234 could include one or more wireless-communication links and/or one or more wired-communication links.

In a preferred embodiment, devices 212 and hub 102 comprise any device capable of forming a PAN, although the present invention may be implemented for devices not forming a PAN. Devices 212 may comprise a gun-draw sensor, a body temperature sensor, an accelerometer, a heart-rate sensor, a breathing-rate sensor, a camera, a man-down sensor, a GPS receiver capable of determining a location, speed, and direction of the user device, smart handcuffs, an electric-field detector, a clock, calendar, sound detector, environmental sensors (e.g. a thermometer capable of determining an ambient temperature, humidity, presence of dispersed chemicals, radiation detector, electric field detector, magnetic field detector, etc.), an accelerometer, a biometric sensor (e.g., wristband), a barometer, speech recognition circuitry, a gunshot detector, an ambient sound detector . . . , etc. Some examples follow:

A sensor-enabled holster 212 may be provided that maintains and/or provides state information regarding a weapon or other item normally disposed within the user's sensor-enabled holster 212. The sensor-enabled holster 212 may detect a change in state (presence to absence) and/or an action (removal) relative to the weapon normally disposed within the sensor-enabled holster 212. The detected change in state and/or action may be reported to a portable radio acting as hub 102 via its short-range transceiver. In some embodiments, the sensor-enabled holster may also detect whether the first responder's hand is resting on the weapon even if it has not yet been removed from the holster and provide such information to portable radio 102. Other possibilities exist as well. Such sensor-enabled holsters typically comprise a switch that is "pressed" when a gun is inserted into a holster. Removal of the gun causes the switch to activate.

A biometric sensor 212 (e.g., a biometric wristband) may be provided for tracking an activity of the user or a health status of the user 101, and may include one or more movement sensors (such as an accelerometer, magnetometer, and/or gyroscope) that may periodically or intermittently provide to the portable radio (acting as hub 102) indications of orientation, direction, steps, acceleration, and/or speed, and indications of health such as one or more of a captured heart rate, a captured breathing rate, and a captured body temperature of the user 101, perhaps accompanying other information.

An accelerometer 212 may be provided to measures acceleration and provide this information to hub 102. Single and multi-axis models are available to detect magnitude and direction of the acceleration as a vector quantity, and may be used to sense orientation, acceleration, vibration shock, and falling. A gyroscope is a device for measuring or maintaining orientation, based on the principles of conservation of angular momentum. One type of gyroscope, a microelectromechanical system (MEMS) based gyroscope, uses lithographically constructed versions of one or more of a tuning fork, a vibrating wheel, or resonant solid to measure orientation. Other types of gyroscopes could be used as well. A magnetometer is a device used to measure the strength and/or direction of the magnetic field in the vicinity of the device, and may be used to determine a direction in which a person or device is facing.

A heart rate sensor 212 may be provided and use electrical contacts with the skin to monitor an electrocardiography (EKG) signal of its wearer, or may use infrared light and imaging device to optically detect a pulse rate of its wearer, among other possibilities, and report this information to hub 102.

A breathing rate sensor 212 may be provided to monitor breathing rate and provide this information to hub 102. The breathing rate sensor may include use of a differential capacitive circuits or capacitive transducers to measure chest displacement and thus breathing rates. In other embodiments, a breathing sensor may monitor a periodicity of mouth and/or nose-exhaled air (e.g., using a humidity sensor, temperature sensor, capnometer or spirometer) to detect a respiration rate. Other possibilities exist as well.

A body temperature sensor 212 may be provided, and report temperature to hub 102. Such a sensor includes an electronic digital or analog sensor that measures a skin temperature using, for example, a negative temperature coefficient (NTC) thermistor or a resistive temperature detector (RTD), may include an infrared thermal scanner module, and/or may include an ingestible temperature sensor that transmits an internally measured body temperature via a short range wireless connection, among other possibilities. Temperature sensor 212 may be used on equipment to determine if the equipment is being worn or not. For example, temperature sensor 212 may exist interior to a bullet-proof vest. I the temperature sensor 212 senses a temperature above a predetermined threshold (e.g., 80 degrees), it may be assumed that the vest is being worn by an officer.

A microphone 212 may be provided to sense an ambient audio environment surrounding an officer. The microphone 212 will detect a pulsing stun-gun audio signal having a pulse interval and maximum duration that is similar to that of the electro-static discharge of the stun gun (similar to that of the electro-static discharge with similar audio-characteristics such as a bursty noise up to 5 s with characteristic sub-noise at 19 ms intervals). If such a pulse is detected, this information can be reported to hub 102.

An electric or magnetic field detector 212 may be provided to sense an ambient electric or magnetic field surrounding the officer. The electric or magnetic field detector 212 will detect a pulsing electric or magnetic field having a pulse interval and maximum duration that is similar to that of the electro-static discharge of the stun gun (e.g., such as a bursty noise up to 5 s with characteristic sub-noise at 19 ms intervals). If such a pulse is detected, this information can be reported to hub 102.

Computer 214 comprises, or is part of a computer-aided-dispatch center or command center, manned by an operator providing necessary dispatch operations. For example, computer 214 typically comprises a graphical user interface that provides the dispatch operator necessary information about public-safety officers. As discussed above, much of this information originates from devices 212 providing information to hub 102, which forwards the information to RAN 202/network 206 and ultimately to computer 214. Computer 214 is thus configured to receive sensor data from sensors 212 and keep track of relevant information. For example, each user of the system may possess a hub with many associated devices forming a PAN. For each user of the system, computer 214 may track the user's current associated PAN devices (sensors 212) along with sensor data for that user. This information may be used to compile a summary for each user (e.g., equipment on hand for each user, along with state information for the equipment (gun drawn, battery low, heart rate high, . . . , etc.)). The information is preferably stored in database 264.

Figure 3:
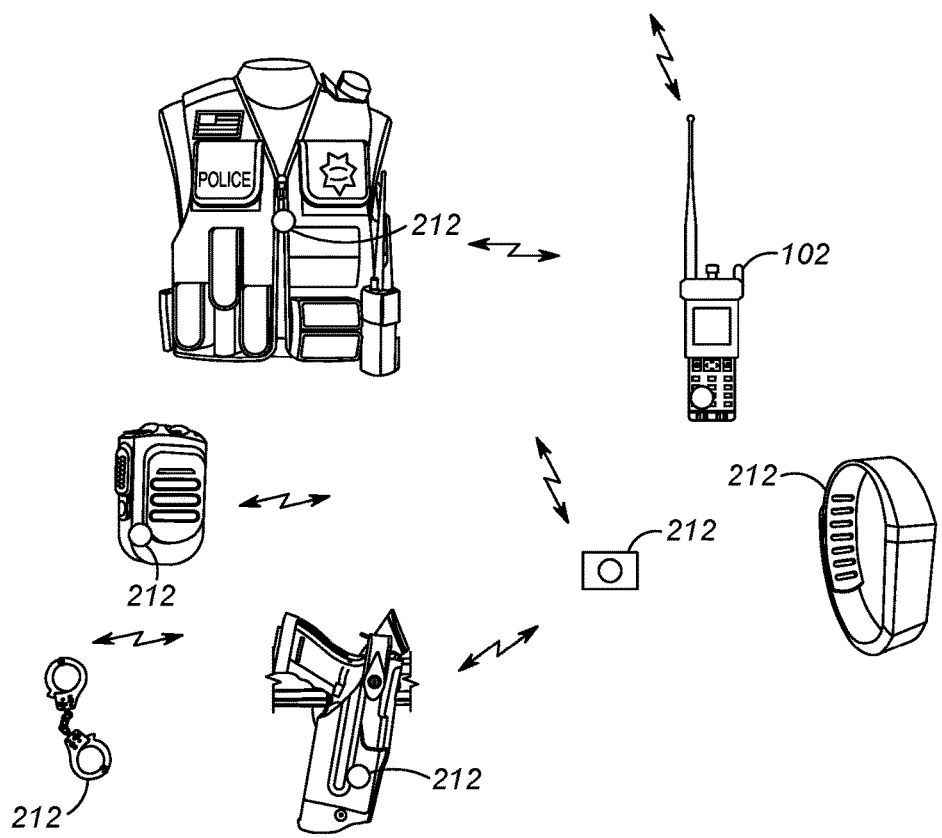
FIG. 3 is a more-detailed view of a personal-area network of FIG. 2.

FIG. 3 depicts another view of a personal-area network 240 of FIG. 2. Personal-area network comprises a very local-area network that has a range of, for example 10 feet. As shown in FIG. 3, various devices 212 are that attach to clothing utilized by a public-safety officer. In this particular example, a bio-sensor is located within a police vest, a sound detector is located within a police microphone, smart handcuffs 212 are usually located within a handcuff pouch (not shown), a gun-draw sensor is located within a holster, an electric/magnetic-field detector 212 is located in smart watch 212, and a camera 212 is provided.

Devices 212 and hub 102 form a PAN 240. PAN 240 preferably comprises a Bluetooth PAN. Devices 212 and hub 102 are considered Bluetooth devices in that they operate using a Bluetooth, a short range wireless communications technology at the 2.4 GHz band, commercially available from the "Bluetooth special interest group". Devices 212 and hub 102 are connected via Bluetooth technology in an ad hoc fashion forming a PAN. Hub 102 serves as a master device while devices 212 serve as slave devices.

Hub 102 provides information to the officer, and/or forwards local status alert messages describing each sensor state/trigger/status over a wide-area network (e.g., network 204 or network 206) to computer 214. In alternate embodiments of the present invention, hub 102 may forward the local status alerts/updates for each sensor to mobile and non-mobile peers (shift supervisor, peers in the field, etc.), or to the public via social media. Thus, hub 102 receives sensor information from sensors 212 via a first network (e.g., Bluetooth PAN network), and forwards the information to computer 214 via a second network (e.g., wide area network (WAN) such as network 204 or network 206).

As described above, it is desirable to report when a stun gun has been fired. In order to address this desire, during operation dispatch center 214 and/or hub 102 will have knowledge of a state of devices 212 used to form an officer's personal-area network (PAN) 240. A gun-draw detector 212 may notify hub 102/dispatch center 214 when a stun gun has been drawn. An electric field detector 212 may notify the hub 102/dispatch center 214 when an electric field having stun-gun fire characteristics (stun-gun fingerprint) has been detected. A magnetic field detector may notify hub 102/dispatch center 214 when a magnetic field having stun-gun fingerprint has been detected. Finally, a microphone 212 (in this embodiment, located in hub 102) may notify the hub 102/dispatch center 214 when sound is detected having stun-gun fingerprint.

Hub 102 and/or dispatch center 214 may map the state of any sensor to a state of a stun (gun fired or not). For example, a single sensor 212 may be utilized to determine if a stun gun has been fired, or a combination of sensors 212 may be utilized to determine if a stun gun has been fired. Some examples follow:

Any one of an electric field sensor, an audio sensor, or a magnetic field sensor may be used to indicate the stun gun has been fired if the sensors detect a field or sound that pulses similar to a fired stun gun's voltage. Thus, a single sensor may be used to determine a stun-gun state.

A gun-draw sensor and an electric field sensor may be mapped to a stun-gun fired state. In this example, the gun-draw sensor 212 indicating that a gun has been drawn, and the electric-field detector 212 indicating that a pulsing electric field has been detected (matching the pulse rate and duration of a stun gun) will be used to indicate that a stun gun has been fired. Thus, multiple sensor states will need to be used to indicate a stun-gun state (e.g., gun drawn AND electric field detected matching stun gun=stun-gun state of fired).

A gun-draw sensor and a magnetic-field sensor may be mapped to a stun-gun fired state. In this example, the gun-draw sensor 212 indicating that a gun has been drawn, and the magnetic-field detector 212 indicating that a pulsing magnetic field has been detected (matching the pulse rate and duration of a stun gun) will be used to indicate that a stun gun has been fired. Thus, multiple sensor states will need to be used to indicate a stun-gun state (e.g., gun drawn AND magnetic field detected matching stun gun=stun-gun state of fired)

A gun-draw sensor and an ambient-sound sensor may be mapped to a stun-gun fired state. In this example, the gun-draw sensor 212 indicating that a gun has been drawn, and the ambient-sound detector 212 indicating that a pulsing electric field has been detected (matching the pulse rate and duration of a stun gun) will be used to indicate that a stun gun has been fired. Thus, multiple sensor states will need to be used to indicate a stun-gun state (e.g., gun drawn AND sound detected matching stun gun=stun-gun state of fired)

The mapping process preferably comprises an operation that associates each element of a given set (the domain) with one or more elements of a second set (the range). The PAN sensor state for officer devices 212 comprises the domain, while the state for a stun gun (fired/not-fired) comprises the range. The mapping may be explicit based on predefined rules, or the mapping may be trained via neural network modeling. This is illustrated in Table 2 below.

TABLE 2

Some Example Mappings of Sensor State to Stun-Gun State

| Sensor State for officer | Mapped state of Stun Gun |
| --- | --- |
| Gun draw sensor indicates stun gun has been drawn AND electric field detector detects pulsing electric field matching stun gun being fired. | Stun-Gun State = Stun-Gun Fired |
| Gun draw sensor indicates stun gun has been drawn AND electric field detector detects no pulsing electric field | Stun-Gun State = Stun-Gun Not Fired |
| Gun draw sensor indicates stun gun has been drawn AND sound detector detects pulsing sound matching stun gun being fired | Stun-Gun State = Stun-Gun Fired |
| Gun draw sensor indicates stun gun has been drawn AND sound detector detects no pulsing sound | Stun-Gun State = Stun-Gun Not Fired |
| . . . etc. | . . . etc. |

It should be noted that the mapping of sensor data with stun-gun state (fired, not fired) can be done at command center 214 and/or hub 102, however in alternate embodiments mapping may be done within the public-safety core network 204, or more computing devices in a cloud compute cluster (not shown), or some other sensor 212 or communication device (for example a radio operated by an officer in the field), and/or may be a distributed communication device across two or more entities.

Figure 4:
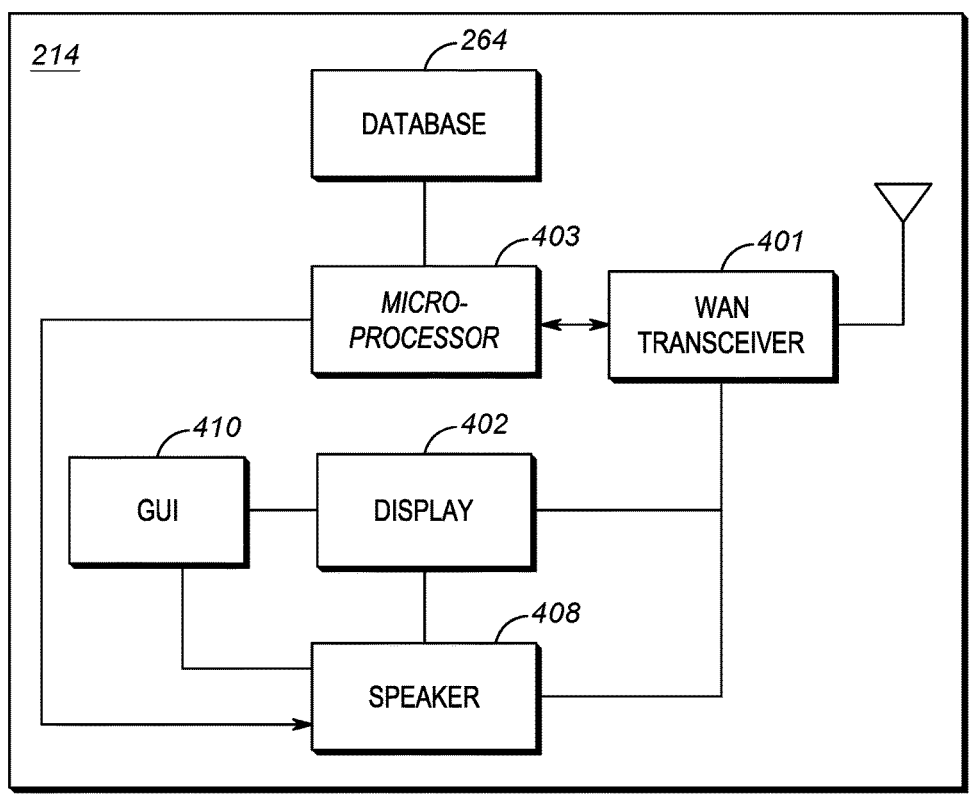
FIG. 4 is a block diagram of a hub.

FIG. 4 shows those components (not all necessary) for dispatch center 214 to determine sensor states and map at least one sensor state to a stun-gun state. As shown, dispatch center 214 may include a wide-area-network (WAN) transceiver 401 (e.g., a transceiver that utilizes a public-safety communication-system protocol and/or a high-speed data network protocol), display 402, logic circuitry 403, graphical user interface (GUI) 410, database 264 (in this embodiment shown internal to computer 214), and speaker 408. In other implementations, dispatch center 214 may include more, fewer, or different components. Regardless, all components are connected via common data busses as known in the art.

WAN transceiver 401 may comprise well known long-range transceivers that utilize any number of network system protocols. (As one of ordinary skill in the art will recognize, a transceiver comprises both a transmitter and a receiver for transmitting and receiving data). For example, WAN transceiver 401 may be configured to utilize a next-generation cellular communications protocol operated by a cellular service provider, and/or any public-safety protocol such as an APCO 25 network or the FirstNet broadband network. WAN transceiver 401 receives sensor data from all PANs 240. It should be noted that WAN transceiver 401 is shown as part of dispatch center 214, however, WAN transceiver 401 may be located in RAN 202 (e.g., a base station of RAN 202), with a direct link to dispatch center 214.

Display 402 comprises any combination of a touch screen, a computer screen, or any interface capable of displaying sensor status streamed from hub 102. It should be noted that for ease of illustration, only a single display is shown in FIG. 4, however in alternate embodiments of the present invention, multiple displays may be present, each streaming a different information from different officers.

Speaker 408 is shown coupled to display 402, and is used to provide an audible output for video on display 402. Speaker 408 may output an audible warning when it has been determined that a stun-gun has been fired. Only one speaker 408 is shown in FIG. 4, however it should be noted that many speakers may be present.

GUI 410 comprises provides a man/machine interface for receiving an input from a user and controlling display 402 and speaker 408. For example, GUI 410 may provide a way of manually muting or un-muting speaker 408, displaying sensor status, controlling a video source shown on display 402, . . . , etc. In order to provide the above features (and additional features), GUI 410 may comprise any combination of a touch screen, a computer screen, a keyboard, or any other interface needed to receive a user input and control display/speaker accordingly.

Logic circuitry 403 comprises a digital signal processor (DSP), general purpose microprocessor, a programmable logic device, or application specific integrated circuit (ASIC) and is configured map sensor data to a stun-gun state as described above in an automated (e.g., without further user input) or semi-automated (e.g., with some further user input) fashion. More particularly, logic circuitry 403 receives sensor state information from each officer's PAN sensors 212. This information is stored in database 264. Logic circuitry will map the sensor state for an officer to a stun-gun state for the officer. Speaker 408 will be controlled accordingly to provide an audible warning when a stun gun has been fired. It should be noted that any adjustment to speaker 408 may be overridden by an input from GUI 410 so that a user can mute or unmute speaker 410 as they desire, or otherwise cancel the alarm.

Database 264 is provided. Database 264 comprises standard memory (such as RAM, ROM, . . . , etc.) and serves to store user identifications along with associated hubs 102, their PAN devices 212, and device status/sensor states (the state of each PAN device). As an example, PAN state information may comprise a battery level, ammunition level, RF signal strength, inventory of emergency aid such as adrenaline shots, gauze, a gun-draw state, electric-field pulse detect state, magnetic field pulse detect state, audible pulse detect state, . . . , etc. Additionally, database 264 may also comprise mappings from sensor state to stun-gun state as shown in Table 1.

During operation of dispatch center 214, sensor data is received by WAN transceiver 401. This sensor data is stored in database 264. Among sensor data received and stored may be a holster sensor state indicating whether or not a stun gun is holstered, an electric field sensor state indicating whether or not a pulsating, electric field has been detected matching that of a stun gun firing, a magnetic field sensor state indicating whether or not a pulsating magnetic field has been detected matching that of a stun gun firing, and/or an ambient noise detector state indicating whether or not a pulsating sound has been detected matching that of a stun gun firing.

Logic circuitry 403 will map the sensor states to a stun-gun state (fired/not fired) as described above. For example, if a holster-sensor state indicates a stun gun has been drawn, and an electric-field sensor state has indicated a pulsating electric field has been detected matching that of a stun gun, then logic circuitry 403 will map the stun-gun state to "stun gun fired", and send a warning to GUI 410 and/or speaker 408.

It should be noted that in an alternate embodiment of the present invention hub 102 may determine a stun-gun state as described above, and simply provide the stun-gun state to dispatch center 214. In this scenario, dispatch center 214 would not need to map the sensor states to the stun-gun state. Dispatch center 214 would simply receive a stun-gun state (fired/not fired) and sound and appropriately notify an operator.

Figure 5:
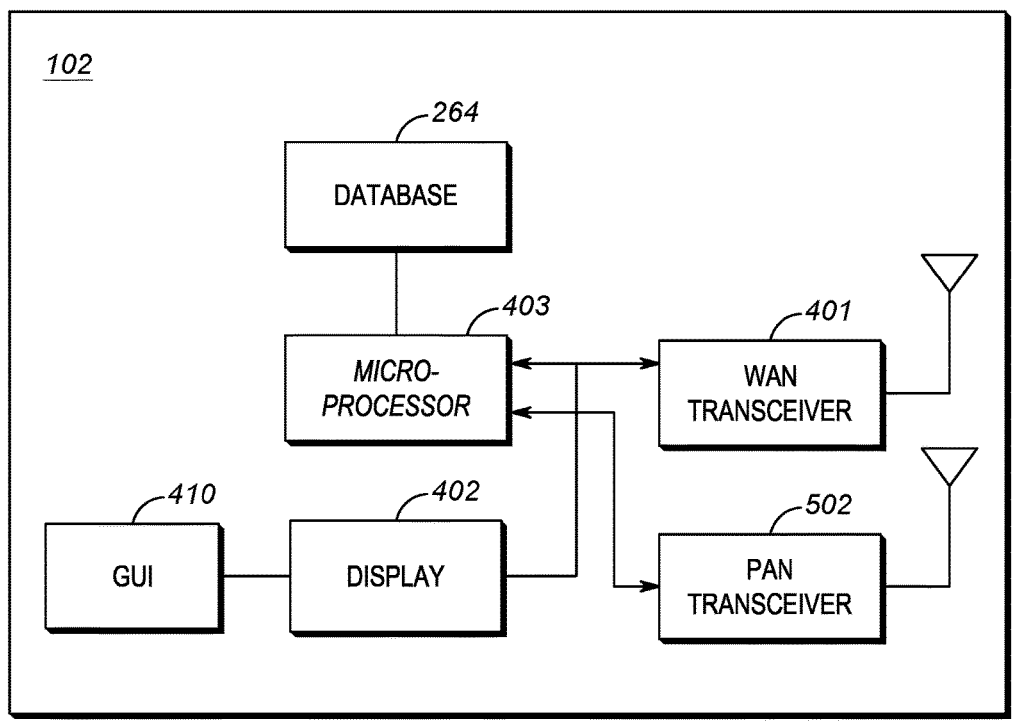
FIG. 5 is a block diagram of a dispatch center.

FIG. 5 is a block diagram of hub 102 that can determine a stun-gun state. As shown, hub 102 includes those elements found in FIG. 4, with the addition of PAN transceiver 502. PAN transceiver 502 may be well known short-range (e.g., 30 feet of range) transceivers that utilize any number of network system protocols. For example, PAN transceiver 502 may be configured to utilize Bluetooth communication system protocol for a body-area network, or a private 802.11 network. PAN transceiver 502 receives sensor state information and provides the state information to logic circuitry 403, which stores and forwards the information via WAN transceiver 401 to dispatch center 214. Other information may be forwarded as well, such as, but not limited to a calculated stun-gun state. Sensor information is stored in database 264. Logic circuitry 403 may determine a stun-gun state as described above. The stun-gun state may be forwarded to dispatch center 214 via WAN transceiver 401. Alternatively, the stun-gun state may not be determined by hub 102, leaving dispatch center 214 to calculate the stun-gun state.

With the above in mind, the apparatuses shown in FIG. 4 and FIG. 5 comprise at least a receiver configured to receive sensor state(s) of at least one sensor, the sensor state(s) indicating whether an electric field, magnetic field, and/or a sound has been detected that matches a periodic voltage pulsing of a stun gun being fired. The apparatuses also include logic circuitry configured to map the sensor state to a stun-gun state, wherein the stun-gun state indicates whether or not the stun gun has been fired.

As discussed, when the above apparatus is embodied within a hub, the receiver receives the sensor state(s) via an over-the-air signal transmitted from the at least one sensor, wherein the at least one sensor is remote from the receiver, and forms a PAN with the receiver.

The at least one sensor is taken from the group consisting of an electric-field sensor, a magnetic-field sensor, a microphone, and a gun-draw sensor, and the logic circuitry maps the stun-gun state to a stun-gun fired state when the gun-draw sensor indicates a stun-gun has been removed from a holster, and at least one of the following occur:
  (1) the electric-field sensor indicates an electric field has been detected that matches a fingerprint of a stun-gun being fired;
  (2) the magnetic-field sensor indicates an electric field has been detected that matches a fingerprint of a stun-gun being fired; or
  (3) the microphone indicates a sound has been detected that matches a fingerprint of a stun-gun being fired.

With the above in mind, hub 102 comprises an apparatus comprising a personal-area network (PAN) transceiver configured to receive sensor state(s) from at least one sensor, the sensor state(s) indicating whether an electric field, magnetic field, and/or a sound has been detected that matches a periodic voltage pulsing of a stun gun being fired. Logic circuitry is provided that is configured to map the sensor state(s) to a stun-gun state, wherein the stun-gun state indicates whether or not the stun gun has been fired. Finally, a wide-area network (WAN) transceiver is provided and configured to transmit the stun-gun state to a dispatch/command center.

As discussed above, the PAN transceiver receives the sensor state(s) via an over-the-air signal transmitted from the at least one sensor, wherein the at least one sensor is remote from the PAN transceiver, and the at least one sensor is taken from the group consisting of an electric-field sensor, a magnetic-field sensor, a microphone, and a gun-draw sensor.

The logic circuitry is configured to map the stun-gun state to a stun-gun fired state when the gun-draw sensor indicates a stun-gun has been removed from a holster, and at least one of the following occur:
  (1) the electric-field sensor indicates an electric field has been detected that matches a fingerprint of a stun-gun being fired;
  (2) the magnetic-field sensor indicates an electric field has been detected that matches a fingerprint of a stun-gun being fired; or
  (3) the microphone indicates a sound has been detected that matches a fingerprint of a stun-gun being fired.

Figure 6:
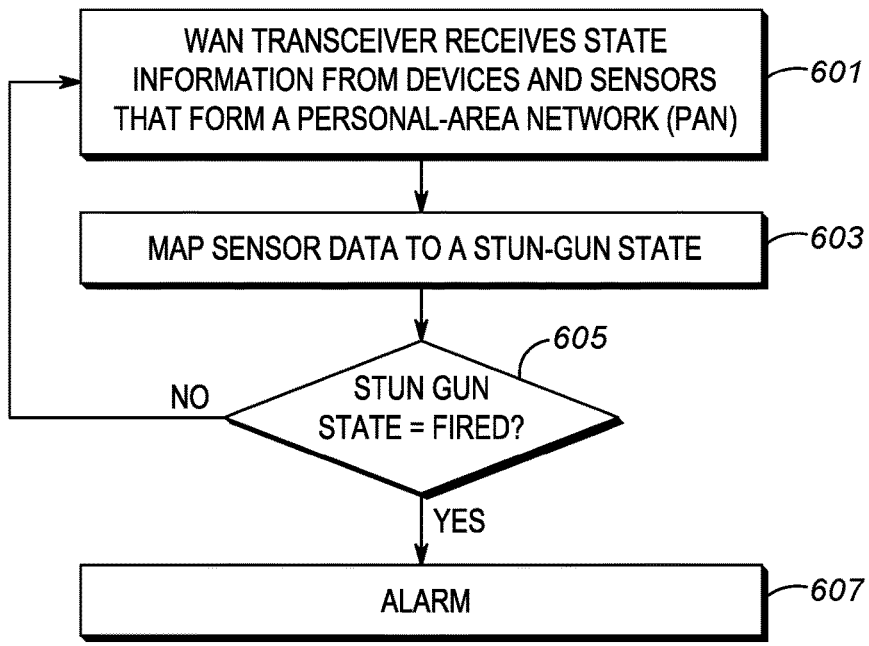
FIG. 6 is a flow chart showing operation of the dispatch center of FIG. 4.

FIG. 6 is a flow chart showing operation of dispatch center of FIG. 4. In particular, the steps shown in FIG. 6 (not all necessary) show those steps taken by dispatch center 214 when analyzing sensor data and determining if a stun gun has been fired. The logic flow begins at step 601 where sensor data is received from hub 102. As discussed above, the sensor data is received via a WAN transceiver. At step 603 logic circuitry 403 maps the sensor data to a stun-gun state. The logic flow continues to step 605 where it is determined if the stun-gun state equals a stun-gun fired state, and if so, the logic flow continues to step 607 where an alarm is provided. The alarm may be audio, visual, or both.

Figure 7:
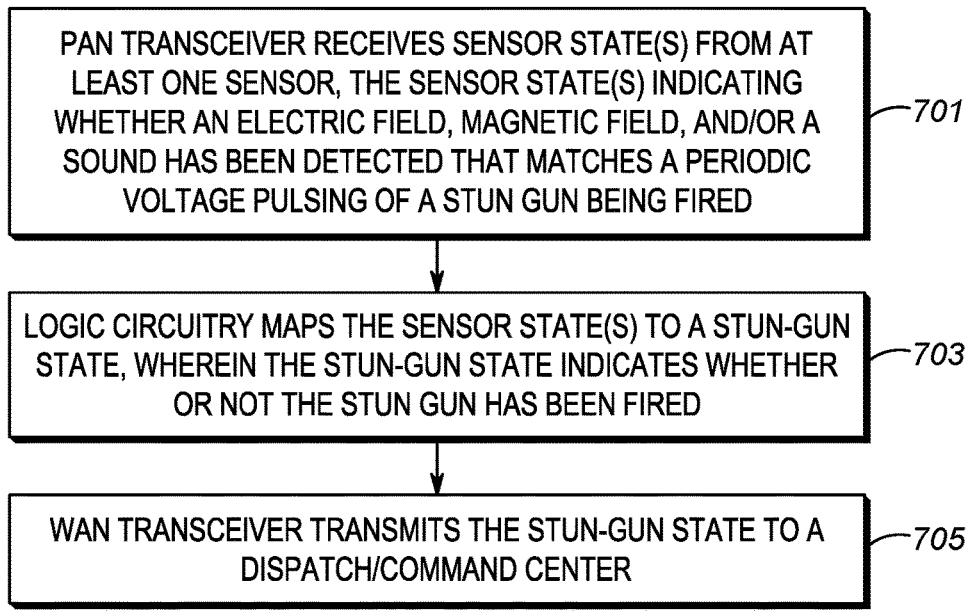
FIG. 7 is a flow chart showing operation of the hub of FIG. 5.

FIG. 7 is a flow chart showing operation of the hub. The logic flow begins at step 701 where PAN transceiver 502 receives sensor state(s) from at least one sensor, the sensor state(s) indicating whether an electric field, magnetic field, and/or a sound has been detected that matches a periodic voltage pulsing of a stun gun being fired. At step 703 logic circuitry 403 maps the sensor state(s) to a stun-gun state, wherein the stun-gun state indicates whether or not the stun gun has been fired. Finally, at step 705 WAN transceiver 401 transmits the stun-gun state to a dispatch/command center.

As discussed above, the step of receiving sensor state(s) comprises the step of receiving the sensor state(s) via an over-the-air signal transmitted from the at least one sensor. Additionally, the at least one sensor is taken from the group consisting of an electric-field sensor, a magnetic-field sensor, a microphone, and a gun-draw sensor.

Finally, the step of mapping the sensor state(s) to a stun-gun state comprises the step of mapping the stun-gun state to a stun-gun fired state when the gun-draw sensor indicates a stun-gun has been removed from a holster, and at least one of the following occur:
  (1) the electric-field sensor indicates an electric field has been detected that matches a fingerprint of a stun-gun being fired;
  (2) the magnetic-field sensor indicates an electric field has been detected that matches a fingerprint of a stun-gun being fired; or
  (3) the microphone indicates a sound has been detected that matches a fingerprint of a stun-gun being fired.

In the foregoing specification, specific embodiments have been described. However, one of ordinary skill in the art appreciates that various modifications and changes can be made without departing from the scope of the invention as set forth in the claims below. For example, deployment and firing of a contact stun gun (where a cartridge is removed and the stun gun itself makes contact with the suspect) is intended to be covered by the above claims. Accordingly, the specification and figures are to be regarded in an illustrative rather than a restrictive sense, and all such modifications are intended to be included within the scope of present teachings.

Those skilled in the art will further recognize that references to specific implementation embodiments such as "circuitry" may equally be accomplished via either on general purpose computing apparatus (e.g., CPU) or specialized processing apparatus (e.g., DSP) executing software instructions stored in non-transitory computer-readable memory. It will also be understood that the terms and expressions used herein have the ordinary technical meaning as is accorded to such terms and expressions by persons skilled in the technical field as set forth above except where different specific meanings have otherwise been set forth herein.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An apparatus comprising:
    a receiver configured to receive sensor states from a gun-drawn sensor and at least one additional sensor, the sensor states from the at least one additional sensor indicating whether an electric field or a magnetic field has been detected that matches a fingerprint of a stun gun being fired; and
    logic circuitry configured to map the sensor states to a stun-gun fired state when:
        (1) the gun-drawn sensor indicates that the stun gun has been removed from a holster, and
        (2) the at least one additional sensor indicates that the electric field or the magnetic field matches the fingerprint of the stun gun being fired.

2. The apparatus of claim 1 wherein the receiver is configured to receive the sensor states via an over-the-air signal transmitted from the gun-drawn sensor and the at least one additional sensor, wherein the at least one additional sensor is remote from the receiver.

3. The apparatus of claim 1 wherein the receiver is configured to receive the sensor states from a hub within a personal-area network (PAN).

4. The apparatus of claim 1 wherein the at least one additional sensor including an electric-field sensor or a magnetic-field sensor.

5. The apparatus of claim 1 wherein the fingerprint of the stun gun being fired including a predetermined pulse interval and a predetermined pulse duration.

6. The apparatus of claim 1, further comprising a radio including the receiver and the logic circuitry.

7. The apparatus of claim 6 wherein the at least one additional sensor including at least one body-worn sensor.

8. An apparatus comprising:
    a personal-area network (PAN) transceiver configured to receive sensor states from a gun-drawn sensor and at least one additional sensor, the sensor states from the at least one additional sensor indicating whether an electric field or a magnetic field has been detected that matches a fingerprint of a stun gun being fired;
    logic circuitry configured to map the sensor states to a stun-gun fired state when:
        (1) the gun-drawn sensor indicates that the stun gun has been removed from a holster, and
        (2) the at least one additional sensor indicates that the electric field or the magnetic field matches the fingerprint of the stun gun being fired; and
    a wide-area network (WAN) transceiver configured to transmit the stun-gun fired state to a dispatch/command center.

9. The apparatus of claim 8 wherein the PAN transceiver is configured to receive the sensor states via an over-the-air signal transmitted from the gun-drawn sensor and the at least one additional sensor, wherein the at least one additional sensor is remote from the PAN transceiver.

10. The apparatus of claim 8 wherein the at least one additional sensor including an electric-field sensor or a magnetic-field sensor.

11. The apparatus of claim 8 wherein the fingerprint of the stun gun being fired including a predetermined pulse interval and a predetermined pulse duration.

12. A method comprising:
   receiving sensor states from a gun-drawn sensor and at least one additional sensor, the sensor states from the at least one additional sensor indicating whether an electric field or a magnetic field has been detected that matches a fingerprint of a stun gun being fired;
   mapping the sensor states to a stun-gun fired state when:
      (1) the gun-drawn sensor indicates that the stun gun has been removed from a holster, and
      (2) the at least one additional sensor indicates that the electric field or the magnetic field matches the fingerprint of the stun gun being fired; and
   transmitting the stun-gun fired state to a dispatch/command center.

13. The method of claim 12 wherein receiving the sensor states comprises receiving the sensor states via an over-the-air signal transmitted from the gun-drawn sensor and the at least one additional sensor.

14. The method of claim 12 wherein the at least one additional sensor including an electric-field sensor or a magnetic-field sensor.

15. The method of claim 12 wherein the fingerprint of the stun gun being fired including a predetermined pulse interval and a predetermined pulse duration.

\* \* \* \* \*